United States Patent [19]
Letham

[11] Patent Number: 6,167,499
[45] Date of Patent: Dec. 26, 2000

[54] MEMORY SPACE COMPRESSION TECHNIQUE FOR A SEQUENTIALLY ACCESSIBLE MEMORY

[75] Inventor: Lawrence Letham, Chandler, Ariz.

[73] Assignee: VLSI Technology, Inc., San Jose, Calif.

[21] Appl. No.: 08/859,168

[22] Filed: May 20, 1997

[51] Int. Cl.$^7$ .................................................. G06F 7/00
[52] U.S. Cl. ............................... 711/212; 710/52; 341/76
[58] Field of Search ........................... 711/212; 395/872, 395/888, 886; 348/401; 341/76, 77, 51, 106, 50, 55; 375/242, 244; 704/503, 504, 201; 710/52, 54, 56; 365/221

[56] References Cited

U.S. PATENT DOCUMENTS

| | | | |
|---|---|---|---|
| 4,095,283 | 6/1978 | Campbell et al. | 365/230.01 |
| 4,323,790 | 4/1982 | Dunning et al. | 370/509 |
| 4,602,333 | 7/1986 | Komori | 341/76 |
| 4,751,675 | 6/1988 | Knauer | 365/78 |
| 4,845,678 | 7/1989 | van Berkel et al. | 365/230.04 |
| 5,253,213 | 10/1993 | Matsumura et al. | 365/230.09 |
| 5,315,696 | 5/1994 | Case et al. | 345/433 |
| 5,341,318 | 8/1994 | Balkanski et al. | 364/725.03 |
| 5,367,649 | 11/1994 | Cedar | 395/384 |
| 5,371,870 | 12/1994 | Goodwin et al. | 395/872 |
| 5,414,701 | 5/1995 | Shtaijer et al. | 370/395 |
| 5,440,753 | 8/1995 | Hou et al. | 711/108 |
| 5,450,599 | 9/1995 | Horvath et al. | 382/233 |
| 5,473,756 | 12/1995 | Traylor | 395/877 |
| 5,477,490 | 12/1995 | Miyawaki et al. | 365/194 |
| 5,487,049 | 1/1996 | Hang | 365/221 |
| 5,493,282 | 2/1996 | Petreye et al. | 340/825.27 |
| 5,526,316 | 6/1996 | Lin | 365/221 |
| 5,535,199 | 7/1996 | Amri et al. | 370/392 |
| 5,550,782 | 8/1996 | Cliff et al. | 365/230.03 |
| 5,577,218 | 11/1996 | Hamaguchi | 711/5 |
| 5,590,279 | 12/1996 | Kawabata et al. | 395/185.06 |
| 5,617,506 | 4/1997 | Burk et al. | 704/201 |
| 5,642,486 | 6/1997 | Whittaker et al. | 710/52 |

OTHER PUBLICATIONS

Jacobson, V. "Compressing TCP/IP Headers for Low–Speed Serial Links," RFC 1144, [Online] http://www.strategis-.com/rfc/RFC11XX/rfc1144.ps, Feb. 1990.

Degermark et al. "Header compression for IPv6," [Online] http://www.dc.luth.se/doc/id/draft–degermark–ipv6–hc–02.txt, Nov. 1996.

Faber et al. "A Thinwire Protocol for connecting personal computers to the Internet," RFC914, [Online] http://www-.faqs.org/rfcs/rfc914.html, Sep. 1984.

Stallings, W. "IPv6: The New Internet Protocol," IEEE Communications: 96–108, Jul. 1996.

*Primary Examiner*—Do Hyun Yoo
*Assistant Examiner*—Yamir Encarnacion
*Attorney, Agent, or Firm*—Woodard, Emhardt, Naughton, Moriarty & McNett

[57] ABSTRACT

A technique for conserving digital memory space is disclosed. This technique includes sequentially transmitting a first address and a second address on a first bus coupled to a FIFO memory. The first address is stored in the memory and compared to the second address to determine a first value corresponding to a difference between the first and second addresses. This first value is written in the memory to represent the second address and has a bit size smaller than the second address. A method to decode the first value to regenerate the second address is also disclosed. These techniques may be further enhanced by only storing an address in a sequential access memory when it differs from the most recently stored address in the memory.

37 Claims, 8 Drawing Sheets

| 15:12 | 11:8 | 7:4 | 3:0 | EX1 |
|---|---|---|---|---|
| 0100b | 0x00 | | 1111b | |

| 15:12 | 11:8 | 7:4 | 3:0 | EX2 |
|---|---|---|---|---|
| 1000b | 0000b | 1010b | 1010b | |

| 15:12 | 11:8 | 7:4 | 3:0 | EX3 |
|---|---|---|---|---|
| 1010b | 0101b | 0101b | 0101b | |

Fig. 6

| 15:12 | 11:8 | 7:4 | 3:0 | W0 |
|---|---|---|---|---|
| 0100b | 0010b | 1101b | 0100b | |

Fig. 7A

| 15:12 | 11:8 | 7:4 | 3:0 | W1 |
|---|---|---|---|---|
| 0000b | 0100b | 1101b | 0100b | |

Fig. 7B

MEMORY SPACE COMPRESSION TECHNIQUE FOR A SEQUENTIALLY ACCESSIBLE MEMORY

BACKGROUND OF THE INVENTION

The present invention relates to sequentially accessible memories and more particularly, but not exclusively, relates to a technique to conserve First-In First-Out (FIFO) memory space.

Sequentially accessible memories, such as FIFO devices, are frequently employed in digital processing systems. In one application, FIFO's are utilized to buffer digital information being transferred from one device to another. Sometimes this information includes data and an address to direct the data before or after buffering. The buffering capacity of such arrangements depends on the number of FIFO locations available. Thus, there is a demand for a storage technique which optimizes utilization of the FIFO memory to buffer a digital information stream including data and associated addresses. This need exists not only for FIFO buffering applications, but also for any FIFO system that routinely stores data and associated address information.

The present invention meets this need and provides other significant advantages.

SUMMARY OF THE INVENTION

The present invention relates to a technique to conserve memory space for a sequentially accessible memory device. Various aspects of the invention are novel, non-obvious, and provide various advantages. While the actual nature of the invention covered herein can only be determined with reference to the claims appended hereto, certain features which are characteristic of the preferred embodiment disclosed herein are described briefly as follows.

In one feature of the present invention, digital memory space is conserved by sequentially transmitting a first address and a second address on a first bus coupled to a first-in first-out memory. The first address is stored in the memory and compared to the second address to determine a first value corresponding to a difference between the first and second addresses. This first value is written in the memory to represent the second address, and has a bit size smaller than the second address. As used herein, an "address" includes any digital value or code utilized to access, channel, or otherwise direct one or more data bits associated therewith.

In another feature of the present invention, a first address is stored in a sequential access memory. The first address is paired with a first data segment. The first data segment is also stored in the memory. The first address and a second address paired with a second data segment are compared. A value corresponding to the second address is stored in the memory after this comparison unless the address for the first data segment and address for the second data segment are the same. The second data segment is stored in the memory after it is determined whether the second address should be stored.

In yet another feature of the present invention, a decoding technique is provided that includes reading a number of sets of digital information from a first-in first-out memory. The sets each have a data portion and a corresponding code portion. The code portion of each of the sets corresponds to an address for the data portion and is established as a function of a difference between at least two different addresses. The address for the data portion is generated from the code portion corresponding thereto for each of the sets. This address has a bit size larger than the code portion for each of the sets.

A further feature of the present invention includes a system for storing information that has a sequential access memory with a number of multibit locations. A digital device is configured to sequentially transmit a number of sets of digital information. These sets each have a data string and an address corresponding to the data string. Control logic is operatively coupled to the digital device and memory. This logic generates a number of coded multibit segments each representing the address of a corresponding one of the sets. The segments each correspond to a difference between two of the addresses consecutively received from the digital device and each has fewer bits than either of the two addresses.

Still another feature of the present invention is a system for storing information having a first digital bus configured to sequentially transmit a number of digital information groups that each have a data string paired with an associated address of multiple bits. The system includes a second digital bus configured to transmit the groups. Furthermore, a first-in first-out memory is included that has a number of multibit locations. This memory also has an input port coupled to the first bus and an output port coupled to the second bus. The memory buffers transmission of the groups from the first bus to the second bus. Control logic is operatively coupled to the memory, the first bus, and the second bus. This logic generates a plurality of values each representing the associated address for a corresponding one of a first number of the groups. The values are each stored in the memory and have fewer bits than the associated addressing being represented.

Accordingly, it is one object of the present invention to conserve memory space for a sequentially accessible memory device.

It is another object to optimize storage in a FIFO memory.

Yet another object of the present invention is to buffer a digital information stream including data and associated addresses with a FIFO memory.

Further objects, features, benefits, aspects, and advantages of the present invention will be apparent from the description and drawings provided herein.

BRIEF DESCRIPTION OF THE DRAWINGS

FIG. 2 is a schematic view of an address encoding format utilized by the system of FIG. 1.

FIGS. 4–6 are schematic examples of encoded addresses.

FIGS. 7A–7B schematically illustrate an uncoded address.

DESCRIPTION OF THE PREFERRED EMBODIMENT

Figure 1:
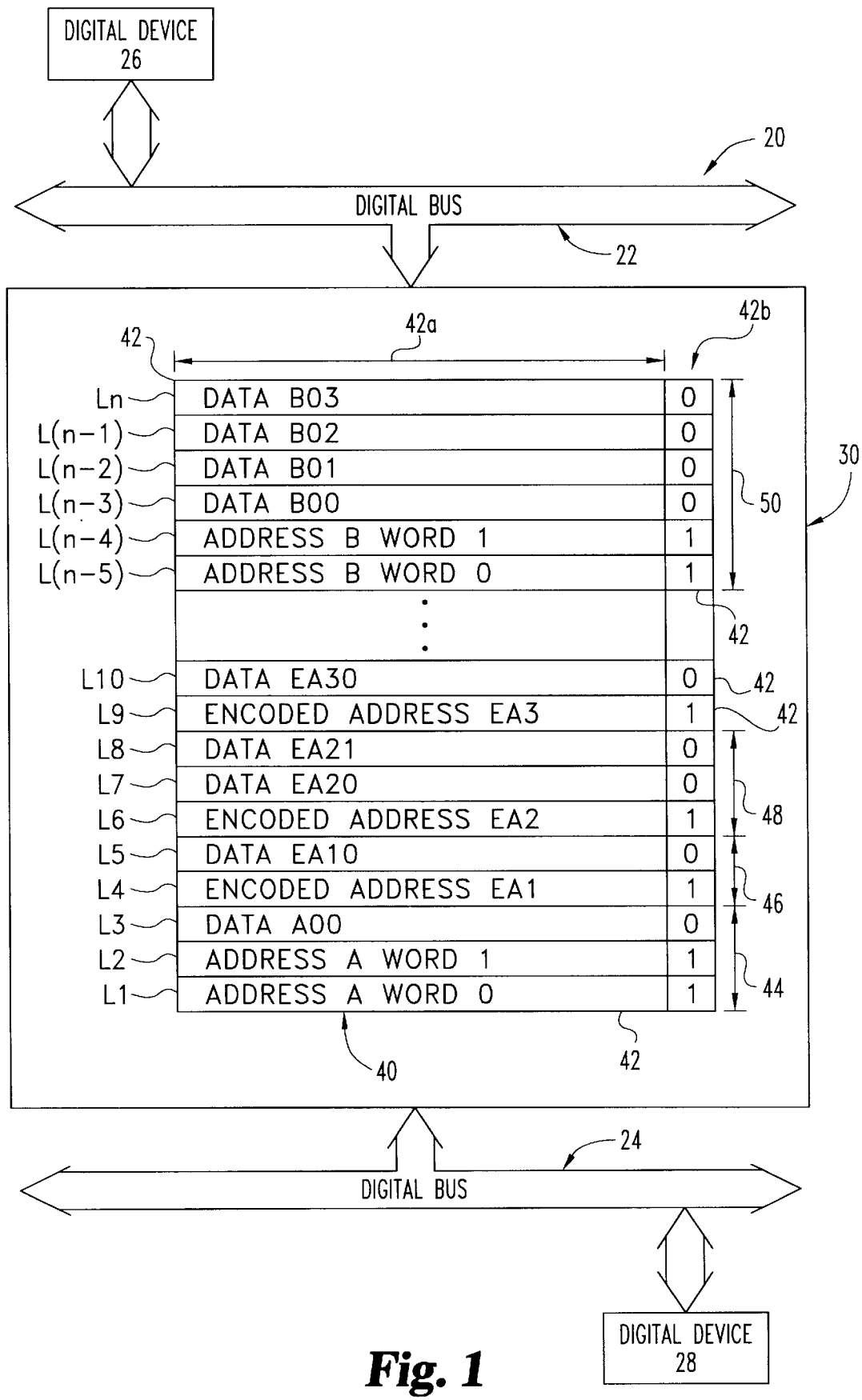
FIG. 1 is a schematic view of a digital information buffering system of the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended. Any alterations and further modifications in the described device, and any further applications of the principles of the invention as described herein are contemplated as would normally occur to one skilled in the art to which the invention relates.

FIG. 1 depicts a digital information buffering system 20 of the present invention. System 20 includes digital information bus 22 operatively coupled to buffer 30 and digital device 26. System 20 also includes digital information bus 24 operatively coupled to buffer 30 and digital device 28. Buffer 30 includes a dual port First-In First-Out memory (FIFO) 40 having a number of memory locations 42. Each memory location 42 has multibit word portion 42a and flag bit 42b. Only a few of memory locations 42 are designated by reference number to preserve clarity.

Several logical locations corresponding to memory locations 42 of FIFO 40 are represented in FIG. 1. Logical location L1 corresponds to memory location 42 storing the oldest information that has not yet been read out of FIFO 40—the "first-in" location. Logical location Ln corresponds to memory location 42 storing the newest unread information—the "last-in" location. The sequence of logical locations from the oldest unread location to the newest unread location is L1, L2, L3–10, . . . , L(n–2), L(n–1), Ln.

System 20 is configured to send a digital stream of information from bus 22 to bus 24 via buffer 30. The digital information includes data words paired with associated addresses. This digital information is input to buffer 30 from bus 22 through a write operation. Buffer 30 is configured to recognize an address/data pair as a set and directs storage in FIFO 40 accordingly. The buffered information is output to bus 24 through a read operation. Buffer 30 outputs address/data sets in a first-in first-out sequence determined relative to the order received from bus 22.

In one embodiment, device 26 puts an address/data pair onto bus 22 and initiates the write operation of buffer 30. Device 28 later initiates a read operation of buffer 30 to transmit the pair to device 28 via bus 24. Digital device 28 then directs the data to an appropriate internal location or I/O port designated by the associated address for this pair. In other embodiments, the address/data pairs are routed and utilized in such other manner as would occur to those skilled in the art.

Typically, the data bit width is less than the address bit width for each address/data pair. For the illustrated embodiment, the data word width is 16 bits and the address width is 28 bits. In this embodiment, word 42a has a width of 16 bits to facilitate storage of a data word in a single memory location 42; however, the 28 bit address width still requires two memory locations 42 for storage in FIFO 42. Alternatively, a FIFO memory wide enough to accommodate the address could be used; however, higher cost, increased device complexity, and wasted data location memory space are likely to result.

To further illustrate, an address/data set 44 is stored in logical locations L1, L2, L3. The full 28 bit address of set 44, address A, is stored in consecutive logical locations L1, L2 as address A word 0, address A word 1, respectively. For set 44, data word A00, is stored logical location L3.

To conserve memory space in FIFO 40, an address encoding technique of the present invention is utilized to facilitate address information storage for an address/data pair in one word 42a as opposed to two words 42a. For example, encoded information set 46 has an encoded address EA1 stored in logical location L4 and corresponding data word EA10 stored in logical location L5. A similar two location set is depicted in locations L9 and L10. The compression of address information from two memory locations 42 to one memory location is based on identifying a relationship between addresses of address/data pairs sent for buffering at different times. This relationship facilitates generation of encoded address EA1 with only a 16 bit width, avoiding the need to occupy two memory locations 42 with the associated address of data word EA10. For this embodiment, data words are stored without encoding; however, in other embodiments, data words may also be encoded using techniques known to those skilled in the art. The address encoding compression technique is further explained further in connection with FIGS. 2–11 and accompanying text hereinafter.

Information group 48 illustrates another memory conservation technique of the present invention. Group 50 depicts a full 28 bit address B and data word B00 sent as an address/data pair to FIFO 40 for storage. Address B is stored in two words as address B word 0 in location L(n–5) and address B word 1 in location L(n–4). Data word BOO is stored adjacent address B in logical location L(n–3). Sometimes, address/data pairs consecutively sent to buffer 30 have the same associated address. Such pairs may occur, for instance, when a stream of data is directed to the same I/O port (e.g. same associated address) of a device on bus 24. Buffer 30 recognizes when redundant addresses are being consecutively sent and stores only the first occurrence to conserve memory space. The data words for consecutively redundant addresses from bus 22 are consecutively stored thereafter.

To distinguish data words and address words, flag bit 42b is employed. Flag bit 42b is active (set to 1) if the corresponding word 42a contains address information and is inactive (set to 0) otherwise. Thus, flag bit 42a is set 1 for logical locations L(n–5) and L(n–4) containing address B, and is set to 0 for data word B00.

Group 50 also includes data words B01, B02, B03. Data words B01, B02, B03 were each consecutively sent to buffer 30 after data word B00, but were also paired with address B. As a result, data words B01, B02, B03 are stored in logical locations L(n–2), L(n–1) Ln; respectively, without repetitively storing address B again. Flag bit 42b is set to 0 for locations L(n–2)–Ln to indicate data contents.

Referring to encoded information group 48, The memory conservation techniques represented by set 46 and group 50 are combined. In group 48, encoded address EA2 is stored in logical location L6 with two consecutive data words EA20, EA21 stored in logical locations L7, L8, respectively. Encoded address EA2 occupies only one word 42a as described for set 46. Data word EA20 is the data word sent to buffer 30 in the pair having the address corresponding to encoded address EA2. This corresponding address was also consecutively sent in a second pair having the data word EA21. Buffer 30 recognized this redundancy, and only stored the accompanying data information, data word EA21, in FIFO 40. The previously stored encoded address EA2 provides the address information for data word EA21. Flag bit 42b is set to 1 for logical location L6 and set to 0 for logical locations L7 and L8 of group 48 to distinguish the information types.

Figures 2, 4, 5:
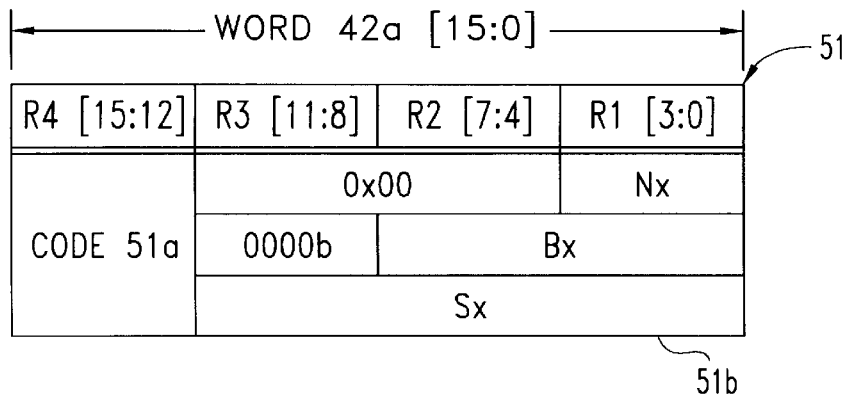

FIG. 2 depicts encoding format 51 which has a 16 bit width corresponding to word 42a. Format 51 is utilized to provide the values of the encoded addresses depicted, for example, as EA1, EA2, EA3, in FIG. 1. Notation for various contiguous multibit ranges designated herein is provided by "[x:y]7" were the argument "x" is the most significant bit and the argument "y" is the least significant bit of the range. Thus, word 42a has the 16 bit range [15:0]. Similarly, hexadecimal values are designated herein by the "0x" prefix and binary values are designated herein by a "b" suffix. Using these conventions, the decimal value 26 is equivalent to 0x1A in hexadecimal notation and 0001 1010b in binary notation. Format 51 has four consecutive bit ranges, R1–R4, where range R1=[3:0], range R2=[7:4], range R3=[11:8], and range R4=[15:12]. The bits of the four bit Range R4 describe code 51a. The remaining ranges R1–R3 of format 51 define changed address portion 51b.

Figure 3:
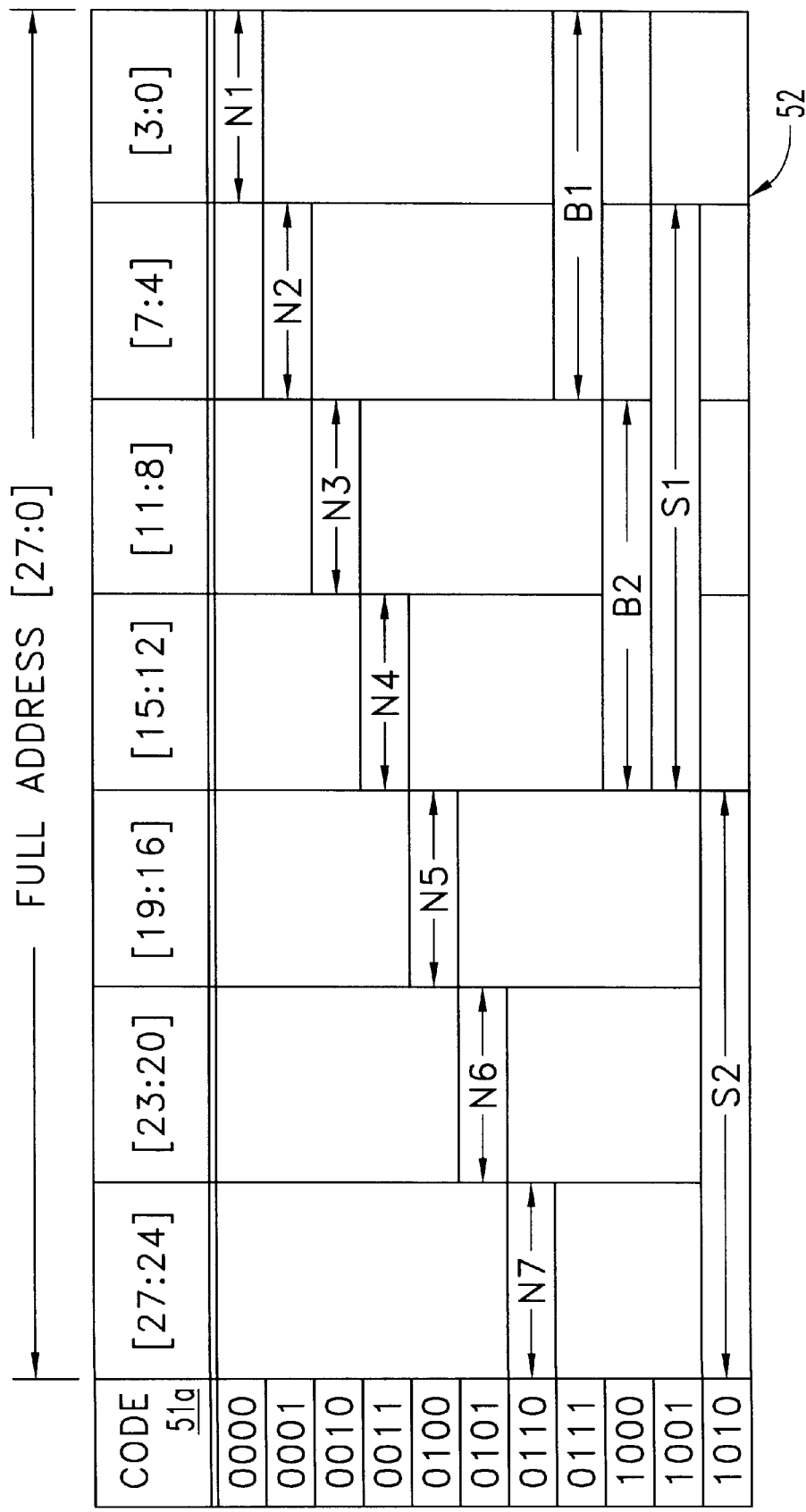
FIG. 3 is a code table corresponding to the encoding format of FIG. 2.

Referring additionally to FIG. 3, encoding table 52 is illustrated. Table 52 maps the integer value of code 51a, ranging from 0–10 (0000b–1010b), to a segment of the 28 bit full address. This 28 bit full address [27:0] is illustrated in seven consecutive ranges of 4 bits each. Values 0–6 (0x00–0x06, 0000b–0110b) of code 51a each map to a corresponding 4 bit nibble N1–N7 segment of the full 28 bit address, where: N1=[3:0], N2=[7:4], N3=[11:8], N4=[15:12], N5=[19:16], N6=[23:20], and N7=[27:24]. Values 7–8 (0x07–0x08, 0111b–1000b) of code 51a each map to a corresponding 8 bit byte segment B1 or B2 of the full 28 bit address, where; B1=[7:0] and B2=[8:15]. Values 9–10 (0x09–0x0A, 1001b–1010b) of code 51a each map to a corresponding 12 bit segment S1 or S2 of the full 28 bit address where S1=[15:4] and S2=[27:16].

To encode a full 28 bit address of a data/address pair sent to buffer 30 by bus 22, a comparison with the most recently sent previous address is performed. This comparison identifies any bits of the address presented for encoding (the current address) which differ from the most recent previous address sent.

If this comparison indicates that all the bits are same—the current address and the most recent previously sent address are identical—then the current address is not stored or encoded and the data word is stored in a logical location next to the most recently stored data as previously discussed. This technique eliminates storage of unneeded, consecutively redundant address information. Set 48 and group 50 provide examples of this technique.

On the other hand, if bits of the current address differ from the most recent previous address, then the segments of the current address represented by one or more of N1–N7, B1–B2, and S1–S2 of table 52 are identified which include all the changed bits. If the changed address bits cannot be fully encompassed by one of the bit ranges corresponding to segments N1, N2, N3, N4, N5, N6, N7, B1, B2, S1, S2; then the current address cannot be encoded by format 51 and table 52. As a result, the current address is stored in two memory locations 42 as in the example given for sets 44 and 50.

If the changed bit or bits provided by the comparison of the current address and the most recent previously sent address may be included in one or more of the table 52 segments (N1–N7, B1–B2, S1–S2), then an encoded address in accordance with format 51 is established and stored in one memory location 42.

To provide an encoded address, the shortest segment N1–N7, B1–B2, S1–S2 from table 52 which still encompasses all the changed bits is selected. The code 51a corresponding to this segment is written in range R4 of format 51. The changed bits corresponding to the segment from table 52 are written into the changed address portion 51b of format 51. If the segment is a nibble N1–N7, then the corresponding nibble of the current address which contains the changed bits is written into segment Nx of format 51. Segment Nx is written into range R1 and ranges R2, R3 are filled with 0 (R2, R3=0x00). If the shortest segment from table 52 that encompasses changed address bits is a byte (B1, B2), then the corresponding byte of the current address is written into segment Bx of format 51. Segment Bx is written into ranges R1, R2=[7:0] and range R3 is filled with 0 (R3=0000b). If the shortest segment from table 52 that encompasses the range of changed bits is a 12 bit segment, then the corresponding 12 bit segment from the current address is written into segment Sx of format 51, where segment Sx occupies ranges R1, R2, R3=[11:0]. As previously discussed, a changed bit segment of the current address which cannot be included within a full address range defined by table 52 (such as a segment of more than 12 bits), precludes encoding in accordance with format 51 and table 52. Consequently, the address is written into two memory locations 42 for this embodiment.

Referring additionally to FIGS. 4–6, a few examples of address encoding in accordance with format 51 and table 52 are provided. In FIG. 4, encoded address EX1 is illustrated. For EX1, the most recent previous address is designated by 0x8888888 and the current address is designated by 0x88F8888. From table 52, the code 51a values which apply are 0100b corresponding to nibble N5 and 1010b corresponding to segment S2. The smaller applicable segment is N5, therefore, code 51a is set to 0100b and stored in range R4 and the changed nibble N5 is stored in segment Nx (range R1) with ranges R2, R3 =0x00. Thus, EX1=0100 0000 0000 1111b=0x400F.

FIG. 5 depicts encoded address EX2 as another example of the encoding technique. For EX2, the most recently sent previous address is designated 0x9999999 and the present address is designated 0x999AA99. Because more than one nibble has changed, a code corresponding to a single nibble (one of N1–N7) cannot fully designate the bits of the current address. Thus, only the byte code valve 1000b designating byte B2 and the segment code valve 1001b designating segment S1 can encompass the changed bits. Applying the policy of selecting the segment with the least number of bits that encompass the change, code 51a is set to byte code 1000b (range R4) and segment Bx (ranges R1, R2) is set to 0XAA=1010 1010b. The remaining nibble, range R3, is set to 0000b, so that EX2=1000 0000 1010 1010b=0x80AA.

FIG. 6 shows encoded address EX3. For EX3, the most recently sent previous address is designated as 0xBBBBBB and the current address is designated as 0x555BBB. Because the segment encompassing the changed bits exceed a byte, then the applicable code value 1010b corresponding to segment S2 applies. Correspondingly, encoded address EX3 has code 51a set to 1010b and the remaining bits, corresponding to segment Sx (ranges R1, R2, R3), are set to 0x555=0101 0101 0101b. Thus, EX3=1010 0101 0101 0101b=0xA555.

It should be noted that not all possible combinations of address bit changes may be encoded with table 52. Preferably, the particular encoded portions, such as nibbles (4 bits), bytes (8 bits) and 12-bit segments, are selected to correspond to the particular application. For example, if a system frequently writes to the same eight locations, then nibble codes would likely be preferred. If a different system frequently transfers information between two banks of memory that are widely separated in the memory map, then codes for the 12-bit groups would be more efficient. In still other embodiments, non-contiguous groups of bits expected to change in a predetermined pattern may be designated by a selected code. Typically, the particular code arrangement will vary with the bit-width of the data, the bit-width of the address, the application, and the relative difference between the data and address format.

FIGS. 7A and 7B depict an uncoded address resulting when the difference between the previous and current addresses cannot be encoded in accordance with format 51 and table 52. For this example, the previous address is given as 0x4444244 and the current address is given as 0x4D442D4. Although both segments S1 and S2, corresponding to codes S1a of 1001b and 1010b collectively encompass the changed bits, only one 12 bit segment may be accommodated by segment Sx of format 51. As a result, two memory locations 42 are utilized to store the address. The two words of the 28 bit address are illustrated as Word W0 in FIG. 7A and Word W1 in FIG. 7B. Nonetheless, in other embodiments, the mapping of table 52 may be adjusted to accommodate the widely spaced bit differences presented in FIGS. 7A and 7B. For instance, a code value of 1011b could be used to write a segment Bx mapped to the non-contigent nibbles N6 and N2, such that Bx=N6N2=0XDD. Such other variations as would occur to those skilled in the art are also within the spirit of the present invention.

Referring back to FIG. 3, it should be noted that when FIFO 40 is empty, the first address stored in FIFO 40 will generally occupy two memory locations 42 in the manner indicated for set 44. However, depending on the particular encoding table, it is likely that the next address may be compressed into one word such as illustrated for set 46. Similarly, set 48 depicts encoded address EA2. Encoded address EA2 is determined by comparing the current full address to the full address corresponding to EA1. As a result, the full address corresponding to the most recently written address information, whether encoded or not, is retained for comparison to the next full address. If the next full address is the same, then it is discarded. If it is different, then it is stored in FIFO 40 as a full address or an encoded address in accordance with table 52. In either case, the full address is retained for the next comparison until a later address is stored in the full or encoded address format.

Figure 8:
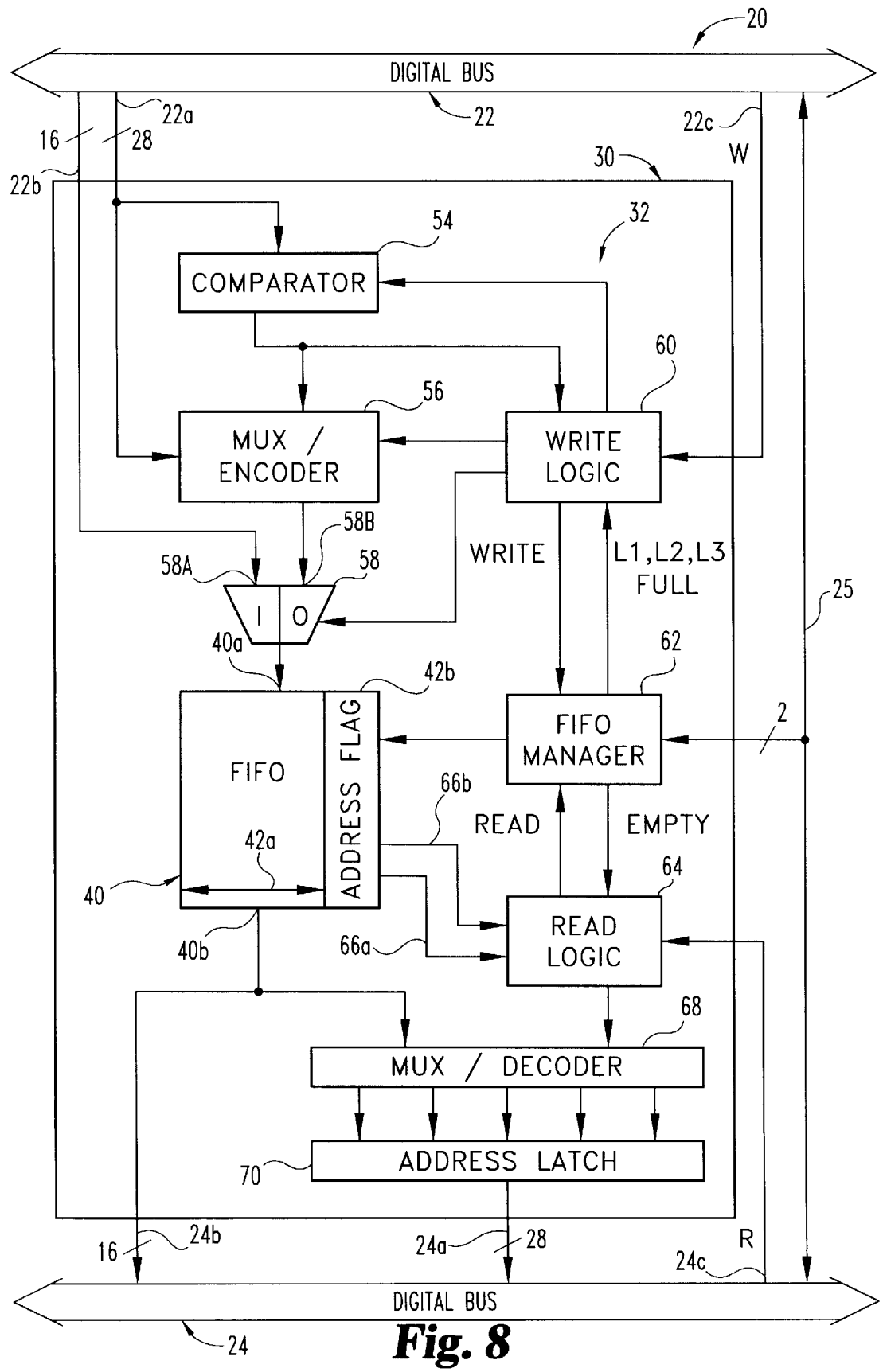
FIG. 8 is a schematic diagram depicting selected details of the system of FIG. 1.

Referring additionally to FIG. 8, further details concerning one implementation of the encoding and decoding techniques within buffer 30 are illustrated. Bus 22 is illustrated with 28 address lines 22a and sixteen data lines 22b operatively coupled to buffer 30. Similarly, bus 24 is operatively coupled to buffer 30, by twenty-eight address lines 24a and sixteen data lines 24b. Preferably, bus 22, 24 and the respective interfaces with buffer 30 are of a conventional variety. Within buffer 30, address lines 22a are input to comparator 54 and MUX/encoder 56. The output of comparator 54 is also input to MUX/encoder 56. Data lines 22b are operatively coupled to input 58a of to multiplexer 58. Input 58b of multiplexer 58 is operatively coupled to the output of MUX/Encoder 56. The output of multiplexer 58 is operatively coupled to input port 40a of FIFO 40.

Write logic 60 is operatively coupled to comparator 54 and MUX/encoder 56 to direct operation thereof. Write logic 60 is also operatively coupled to FIFO manager 62 to provide a WRITE signal thereto. Write logic 60 receives input signal W along control coupling 22c and various inputs from FIFO manager 62. Signal W initiates storage of a data/address pair from bus 22 into buffer 30. Under direction of write logic 60, comparator 54 provides for the comparison of the current address and the most recently sent previous address. In addition, write logic 60 directs MUX/encoder 56 to assemble an encoded address in accordance with format 51 and table 52, sends through each word of a full two word address, or ignore the address as determined from the output of comparator 54. When encoding, MUX/encoder 56 generates the code value, appends the appropriate differing bit segment (N1–N7, B1–B2, or S1 or S2) from the current address, and fills with zeros as required.

FIFO manager 62 controls the input and output of digital information from FIFO 40. FIFO manager 62 cooperates with write logic 60 and read logic 64 to collectively provide buffer control logic 32. Manager 62 includes a write pointer WP designating the next memory location 42 for a write or store operation. Also, manager 62 includes a read pointer RP to designate the next location available for output to bus 24 via output port 40b. As a result RP points to logical location L1. In addition, manager 62 includes the logic necessary to determine whether one, two, or more than two locations are available for a write operation corresponding to signals L1, L2, L3, respectively. Furthermore, manager 62 is configured to generate a FULL signal when all locations of FIFO 40 have been written. Similarly, manager 62 is configured to generate an EMPTY signal when all locations written to FIFO 40 have been read.

Read logic 64 is coupled to FIFO manager 62 and receives the EMPTY signal therefrom. The FULL and EMPTY signals are also distributed to busses 22 and 24 for reception by corresponding bus managers along control couplings 22c, 24c, respectively. Read logic 64 is configured to recognize and decode the encoded addresses stored in FIFO 40. Read logic 62 responds to signal R from coupling 24c to initiate output of a data/address pair from buffer 30 onto bus 24. Read logic 64 provides a READ signal to FIFO manager 62 to initiate a read of data or address. Read logic 64 is coupled to flag bits 42a by lines 66a, 66b, to input the flag bits of the next two memory locations 42 to be read. These bits are examined to determine whether a full address (2 words), an encoded address (1 word), or a data word to be output next. Read logic 64 directs address MUX/decoder 68 to regenerate the full address by substituting the changed segment of the address being read into the previous output address in latch 70. Notably, data read from FIFO 40 is presented directly from output port 40b to bus 24 via data lines 24b. Address latch 70 is coupled to bus 24 via address lines 24a and contains the most recently output address of an address/data pair. Notably, various different control signals and status signals may be included as part of couplings 22c, 24c and 25.

Figure 9:
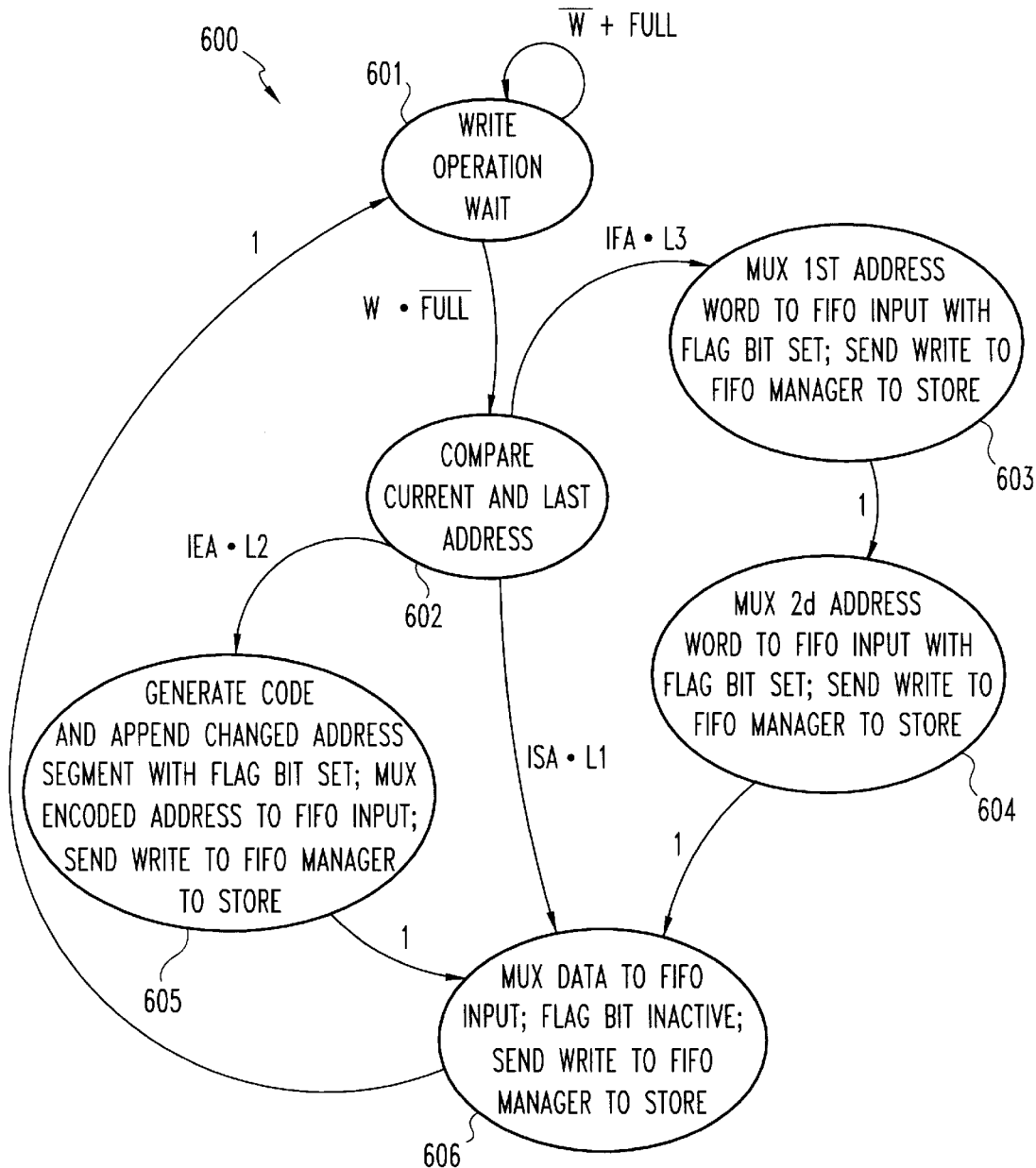
FIG. 9 is a state diagram corresponding to the operation of the write logic depicted in FIG. 8.

FIG. 9 depicts state diagram 600 corresponding to the operation of write logic 60. Write logic 60 idles in state 601 if there is no active write operation signal W (W=0) or FIFO 40 is full as indicated by activation of signal FULL (FULL= 1); such that logic 60 idles as long as (W'+FULL=1). As used herein, a prime (') or an overbar indicates the inverted boolean value of the associated signal or variable. Once signal W is active (W=1), and FULL is inactive (FULL=0), such that (W* FULL=1); then operation proceeds to state 602. In state 602, a comparison with comparator 54 is activated to compare the full two word address currently on lines 22a with the previous full two word address stored in comparator 54. The previous full address stored in comparator 54 is the previous address most recently sent to FIFO 40 by bus 22, which was stored as a full address in two memory locations 42 or stored in encoded form in one memory location 42. Write logic 60 examines any differences detected by this comparison to decide whether two locations, one location, or no locations need to be stored in FIFO 40.

If FIFO 40 is empty (EMPTY=1) or the difference between the current and previous address determined in state 602 cannot be encoded in accordance with table 52, then a full two-word address is needed which activates IFA (IFA=1). Furthermore, if FIFO manager 62 indicates that two or more consecutive locations are available by setting signal L3 active (L3=1), then operation proceeds to state 603 (IFA*L3=1).

In state 603, write logic 60 directs MUX/encoder 56 to put the first address word (word 0) on the output and correspondingly directs multiplexer 58 to present word 0 of the address to input port 40a of FIFO 40. Also, an appropriate bit of input port 40a is set by MUX/encoder 56 to activate corresponding flag bit 42b. Write logic 60 generates a WRITE signal and sends it to manager 62 to write address word 0 (with bit 42a set) to the location designated to by pointer WP. The specific operation of manager 62 in response to the WRITE signal is further detailed in state diagram 620 of FIG. 10 described more fully hereinafter.

After storing address word 0, control flows to state 604 where the output of MUX/encoder 56 presents address word 1 to multiplexer 58. Logic 60, directs multiplexer 58 to input word 1 to input port 40a of FIFO 40 with corresponding flag bit 42b set. Write logic 60 sends an active WRITE signal (WRITE=1) to manager 62 to provide for the storage of word 1 immediately after word 0 to conclude state 604. Operation then proceeds to state 605 where multiplexer 58 is directed to present the data from line 22b of bus 22 to input port 40a of FIFO 40. Write logic 60 then sends an active WRITE signal (WRITE=1) to manager 62 to write the data into the next location of FIFO 40. Notably, the address flag 42b is not set for the data write operation of state 605. The write cycle is then complete and control flows back to wait state 601 of state diagram 600 to idle until the next active write signal W (W=1) and not FULL (FULL=0) condition.

Returning to state 602, if the comparison of the current and previous address indicates the current address may be encoded in accordance with table 52, then an encoded address input is indicated which sets signal IEA active (IEA=1). Furthermore, if manager 62 indicates that at least two locations of FIFO 40 are available, as indicated by an active signal L2 (L2=1), then control proceeds to state 605 (IEA* L2=1). In state 605, the difference between the current and previous address is evaluated by logic 60 and the corresponding code from table 52 is generated. The generated code 51a and corresponding changed address portion 51b are output by MUX/encoder 56 under the direction of logic 60. For example, logic 60 directs MUX/encoder 56 to output code 51a in range R4 and selects the portions of the current and most recently sent previous address to combine as portion 51b. Write logic 60 directs multiplexer 58 to present the resulting encoded address to input port 40a of FIFO 40 and activates an appropriate bit to set the corresponding flag bit 42b. Write logic 60 then sends an active WRITE signal (WRITE=1) to manager 62 to write the encoded address and flag bit 42b into the memory location 42 designated by pointer WP. Control then flows to state 606 where data is directed to input port 40a of FIFO 40 by write logic 60 via multiplexer 58 and subsequently stored before returning to wait state 601.

If the comparison of state 602 determines that the current and previous addresses are the same then no address information is stored and signal ISA is set active (ISA=1). If at least one location 42 is available in FIFO 40, then signal L1 is set active (L1=1). When both ISA and L1 are active, (ISA*L1=1), then control flows directly from state 602 to state 606 to write the corresponding data word to FIFO 40 at the memory location 42 designated by pointer WP. Control then returns to the wait state 601 until another write operation is initiated by signal W.

Figure 10:
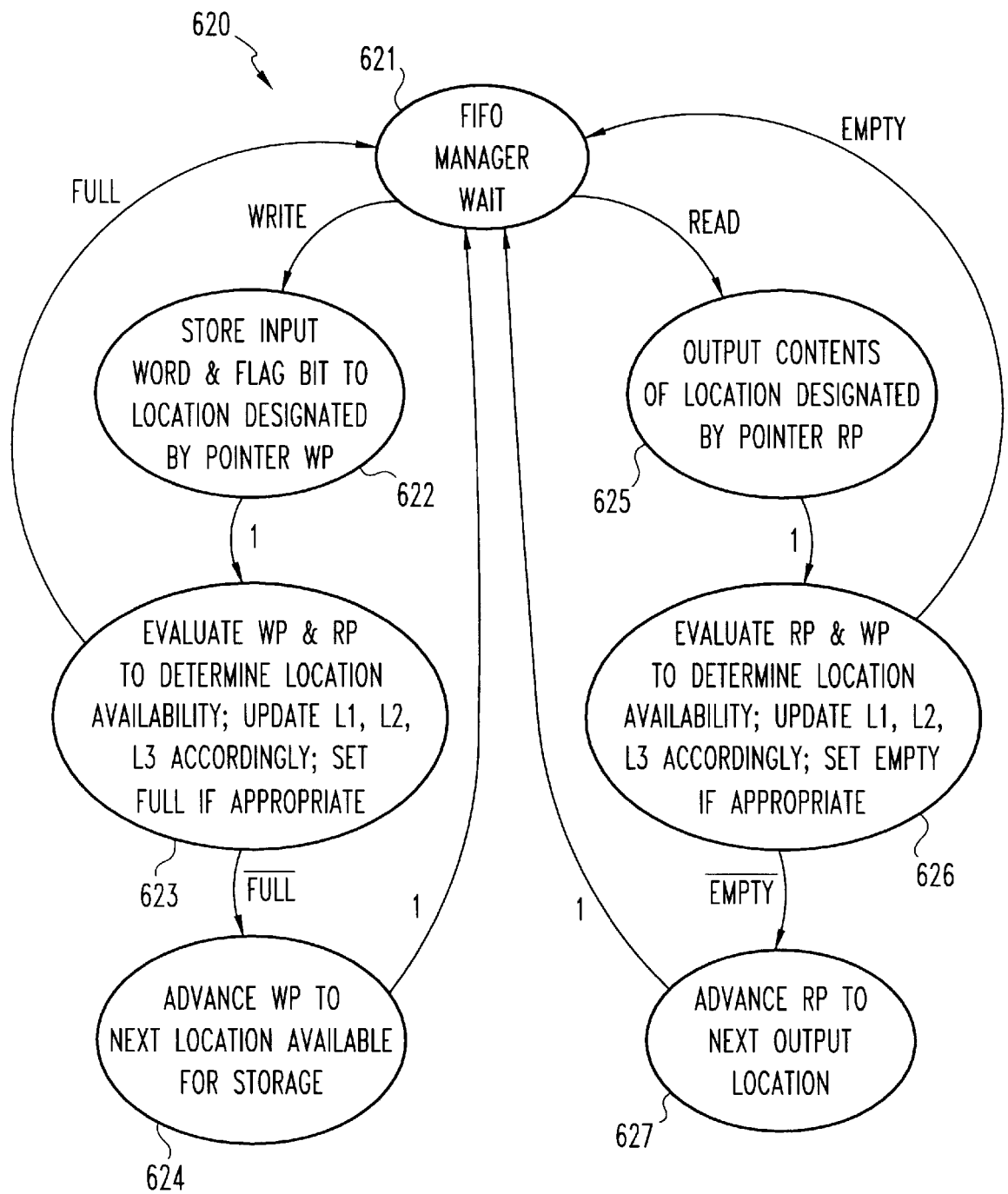
FIG. 10 is a state diagram corresponding to the operation of the FIFO manager depicted in FIG. 8.

FIG. 10 depicts a state diagram 620 for the operation of the FIFO manager 62. State 621 of state diagram 620 is a wait state. If an active WRITE signal is received (WRITE=1), then control flows to state 622. This signal is sent by write logic 60 in states 603, 604, 605, and 606 of state diagram 600. In state 622, the word 42a and flag bit 42b presented at input port 40a of FIFO 40 are stored in the memory location 42 of FIFO 40 designated by write pointer WP. The operation then flows to 623 which evaluates the memory location 42 designated by write pointer WP and the memory location 42 designated by read pointer RP (logical location L1) to determine how many memory locations 42 are still available for writing. In response, the signals L1, L2, L3 are updated accordingly and the signal FULL is set (FULL=1) if there are no locations available. If FULL=1, then control returns to wait state 621. If FULL is not active (FULL=0, FULL'=1), then control advances to state 624. In state 624, the write memory pointer WP is advanced to the next memory location 42 available for storage, then control returns to wait state 621.

State diagram 620 also describes the FIFO reading operation for manager 62. Beginning with wait state 621, if a active READ is received from read logic 64, then the operation advances to state 625. In state 625 the contents of memory location 42 designated by pointer RP (logical location L1) is output at output port 40b of FIFO 40. Control then flows to state 626 to evaluate the locations designated by the read pointer RP and write pointer WP. The state 626 evaluation determines memory location 42 availability and updates L1, L2, L3 accordingly. If it is determined that all memory locations 42 have been read, then the EMPTY signal is set active (EMPTY=1) and control flows back to the FIFO manager wait state 621. On the other hand, if EMPTY is inactive (EMPTY=0, EMPTY'=1), then control advances to state 627. In state 627, the read pointer RP is advanced to the next location designated for output on a first-in first-out basis. Control then returns the wait state 621.

Figure 11:
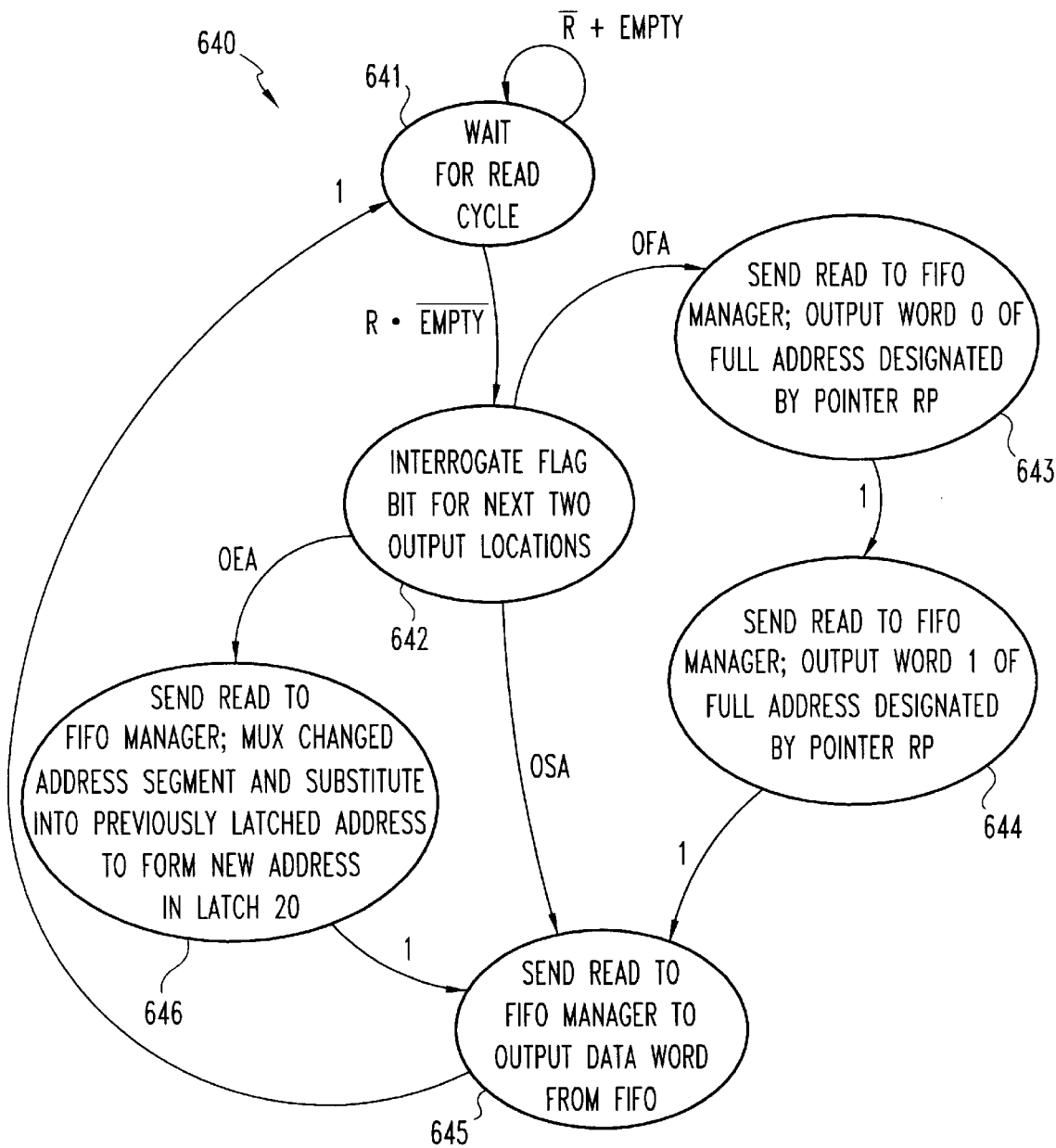
FIG. 11 is a state diagram corresponding the operation of the read logic depicted in FIG. 8.

FIG. 11 further describes the operation of read logic 64 with state diagram 640. State 641 is a wait state. If signal R is inactive (R=0, R'=1) or FIFO 40 is empty as designated by an active EMPTY signal (EMPTY=1), then read logic 64 continues to idle at state 641 (R'+EMPTY=1).

On the other hand, if R is active (R=1) and EMPTY is inactive (EMPTY=0, EMPTY'=1), such that (R*EMPTY'=1), then operation flows to state 642. In state 642, read logic 64 interrogates the flag bit 42b for the output location designated by RP and for the next output location to be read after RP (RP+1) to determine whether a one word encoded address, a full two-word address, or data is to be output through output port 40b of FIFO 40. If a full address output is indicated, (two flag bits 42a set in a row), then signal OFA is set active (OFA=1). As a result, operation flows to state 643. In state 643, read logic 64 sends a READ signal to manager logic 62 and latches the first address word (WORD 0) from the memory location 42 designated by pointer RP into latch 70. Control then flows to state 644. In state 644, another READ signal is sent to manager 62, and the second address word (word 1) is latched into latch 70 as directed by decoder 68 via read logic 64. Control then flows to state 645 where another READ signal is sent to manager 62 to output the data corresponding to the full two-word address output through states 643 and 644. In state 645, data is output from port 40b directly to bus 24 via lines 24b by sending a READ to FIFO manager 62.

If the interrogation of state 642 detects an encoded address (one flag bit 42a set), then signal OEA is active (OEA=1), and control flows to state 646. In state 646, read logic 64 sends a READ signal to manager 62 and activates MUX/decoder 68 to insert the changed address portion 51b corresponding to segment (Nx, Bx, or Sx), as determined from code 51a, into the previous address remaining in address latch 70 from the most recent previous read operation. Control then continues to state 645 where another READ signal is sent by read logic 64 to manager 62 to output data from port 40b directly to bus 24 via lines 24b. The read cycle is then complete and control returns to wait state 641 to idle until another read cycle is activated.

If the interrogation of state 642 indicates that two data words are next to each other (two consecutive flag bits 42b not set), then signal OSA becomes active (OSA=1), indicating that data having the same address as the most recently read address is being output. State 645 is triggered by OSA=1 and read logic 64 sends a READ signal to manager 62 to output the data word designated by read pointer RP on port 40b of FIFO 40. Control then returns to idle at wait state 641 until the next occurrence of R*EMPTY'=1.

In alternative embodiments, the system defined herein may be embedded into one or more logic devices, programmed in software or firmware, or provided by a combination thereof using techniques known to those skilled in the art. Furthermore, while the preferred embodiment illustrates a buffering operation between two parallel bus configurations, it is envisioned that other embodiments may include serial busses, busses that multiplex data and address information, or a single bus having both a read and write interface with buffer 30. In still other embodiments, the compression technique of the present invention may be used for FIFO storage of groups containing data and associated addresses for purposes other than buffering.

In addition, the present invention may be adapted to recognize additional information types besides data/address pairs. By way of non-limiting example, an additional flag bit could be employed to designate an information type which has no associated address—with control logic 32 configured accordingly. In addition, undesignated code values 1011b–1111b may be used to designate different digital information arrangements or blocks other than data/address pairs.

Furthermore, in another embodiment it is recognized that instead of halting writes and reads when the FIFO is full or empty, respectively; the FIFO may be configured in a circular fashion to overwrite the least recently written information when full, or re-read the least recently read information when empty. In still other embodiments the FULL or EMPTY signals may be utilized by devices coupled to busses 22 and 24 to provide for FIFO underflow or overflow control. It is also envisioned that the memory and logic devices disclosed herein may be provided by one or more solid state devices, optical devices, electromagnetic devices, or such other variety as would occur to one skilled in the art. Also, it is recognized that conflicts between reads and writes cycles may be arbitrated as part of the manager logic 62 of buffer 30, or arbitrated by devices and systems external to system 30.

All publications, patents, and patent applications cited in this specification are herein incorporated by reference as if each individual publication, patent, or patent application were specifically and individually indicated to be incorporated by reference.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A method of conserving digital memory space, comprising:
    transmitting a first address a first data segment associated with the first address, and a second address on a first bus coupled to a first-in first-out memory;
    storing the first address and the first data segment in the first-in first-out memory;
    comparing the first address to the second address to determine a first value corresponding to a difference between the first and second addresses; and
    writing the first value in the first-in first-out memory to represent the second address, the first value having a bit size smaller than the second address.

2. The method of claim 1, wherein a second bus is coupled to the first-in first-out memory, and further comprising buffering a digital information stream from the first bus to the second bus through the first-in first-out memory, the stream including a number of sets of digital information, the sets each including a data segment and an associated address.

3. The method of claim 1, wherein the first-in first-out memory includes a number of multibit sequentially accessible memory locations, and the first address is stored in a greater number of the locations of the first-in first-out memory than the first value.

4. The method of claim 1, further comprising generating the second address from the first value and the first address.

5. The method of claim 1, wherein the first value includes a first number of bits designating a portion of the second address, the portion contains at least one bit corresponding to the difference between the first and second addresses, and the first value includes a second number of bits corresponding to a bit pattern of the portion.

6. The method of claim 1, wherein the second address is transmitted on the first bus after the first data segment and the first value is written in the first-in first-out memory after the first data segment is stored in the first-in first-out memory.

7. A method of conserving digital memory space, comprising:
    transmitting a first address, a first data segment associated with the first address, a second address, and a third address to a first-in first-out memory;
    storing the first data segment in the first-in first-out memory;
    comparing the first address to the second address to determine a first value corresponding to a difference between the first and second addresses; [and] storing the first value in the first-in first-out memory to represent the second address, the first value having a bit size smaller than the second address and being stored after the first data segment;
    comparing the second address to the third address to determine a second value corresponding to a difference between the second and third addresses; and
    storing the second value in the first-in first-out memory to represent the third address, the second value having a bit size smaller than the third address.

8. The method of claim 7, further comprising storing the first address in the first-in first-out memory before the first and second values are stored.

9. The method of claim 7, further comprising generating the second address from the first value and the first address and generating the third address from the second value and the second address.

10. The method of claim 7, wherein the first value includes a first number of bits designating a portion of the second address, the portion contains at least one bit corresponding to the difference between the first and second addresses, and the first value includes a second number of bits corresponding to a bit pattern of the portion.

11. The method of claim 7, further comprising:
transmitting the first data segment associated with the first address to the first-in first-out memory before the second address is transmitted to the first-in first-out memory;
transmitting a second data segment associated with the second address to the first-in first-out memory after the first data segment is transmitted to the first-in first-out memory;
storing the second data segment in the first-in first-out memory after the first data segment is stored in the first-in first-out memory;
transmitting a third data segment associated with the third address to the first-in first-out memory after the second data segment is transmitted to the first-in first-out memory; and
storing the third data segment in the first-in first-out memory after the second data segment is stored in the first-in first-out memory.

12. The method of claim 11, wherein the first-in first-out memory includes a number of sequentially accessible multibit locations, and further comprising:
filling the locations of the first-in first-out memory with a number of sets of digital information, the sets each including a data segment and an associated address, a first one of the sets including the first data segment and the first address, a second one of the sets including the second data segment and the second address, a third one of the sets including the third data segment and the third address;
sequentially accessing the sets after said filling; and
generating the associated address for each of the sets as a function of at least two values each stored in a different one of the locations.

13. A method of conserving digital memory space, comprising:
(a) storing a first address in a sequential access memory, the first address being paired with a first data segment;
(b) storing the first data segment in the sequential access memory;
(c) comparing the first address and a second address paired with a second data segment;
(d) storing a value corresponding to the second address in the sequential access memory after acts (a) through (c) unless the first address and the second address are the same; and
(e) storing the second data segment in the sequential access memory after acts (a) through (c).

14. The method of claim 13, wherein the value represents a difference between the first address and the second address.

15. The method of claim 13, wherein the value is a binary representation of the second address.

16. The method of claim 13, wherein the sequential access memory includes a number of sequentially accessible multibit locations and the locations each include a flag bit which designates if a value corresponding to address information is stored therein.

17. The method of claim 13, further comprising multiplexing a data bus and an address bus coupled to the sequential access memory.

18. A method of decoding, comprising:
reading a number of sets of digital information from a first-in first-out memory, the sets each having a data portion and a corresponding code portion, the code portion of each of the sets corresponding to an address for the data portion and being established as a function of a difference between at least two different addresses; and
generating the address for the data portion from the code portion corresponding thereto for each of the sets, the address having a bit size larger than the code portion for each of the sets.

19. The method of claim 18, further comprising accessing a group of digital information stored in the first-in first-out memory, the group including a data portion and an address portion sequentially stored in the first-in first-out memory, and the address portion occupies more memory space than the code portion for any of the sets.

20. The method of claim 18, wherein the first-in first-out memory has an input port coupled to a first bus and an output port coupled to a second bus, and further comprising buffering transmission of a digital information stream from the first bus to the second bus through the first-in first-out memory, the stream including the sets.

21. The method of claim 20, wherein the stream includes a number of groups of digital information, the groups each having a data string and an address portion, the data string for each of the groups having the same number of bits as the data portion for each of the sets, and the address portion for each of the groups having the same number of bits as the address represented by the code portion for each of the sets.

22. The method of claim 18, wherein for each of the sets the code portion has:
a first number of bits designating a segment of the address corresponding to the data portion; and
a second number of bits corresponding to a bit pattern for the segment.

23. The method of claim 22, wherein the segment has a bit width that varies as a function of the difference between the at least two different addresses.

24. A system for storing information, comprising:
a sequential access memory with a number of multibit locations;
a digital device configured to sequentially transmit a number of sets of digital information, the sets each having a data string and an address corresponding to the data string; and
control logic operatively coupled to said digital device and said sequential access memory, said logic being configured to generate a number of coded multibit segments each representing the address of a corresponding one of the sets, the segments each corresponding to a difference between two of the addresses consecutively received from said digital device, the segments each having fewer bits than either of the two addresses.

25. The system of claim 24, wherein said logic includes a multiplexer coupled between said digital device and said sequential access memory.

26. The system of claim 24, wherein:

said sequential access memory includes an input port and an output port; and said logic includes a comparator coupled between said input port and said digital device, and a latch coupled between a digital bus and said output port.

27. The system of claim 24, wherein said sequential access memory defines a plurality of sequentially accessible multibit locations, the coded segments are each sized to fit in a corresponding one of the locations, and the address represented by one of the coded segments for each of the sets has a size larger than any one of the locations.

28. The method of claim 24, wherein the coded segments each have a first number of bits designating a portion of the address represented thereby, the portion contains at least one bit corresponding to the difference between the two addresses, and the coded segments each include a second number of bits corresponding to a bit pattern of the portion of the address designated by the first number of bits.

29. The system of claim 24, wherein said logic generates a first signal when said sequential access memory is empty and a second signal when said sequential access memory is full.

30. The system of claim 24, wherein the coded segments are each stored in said sequential access memory and said data string for each of said sets is stored in said sequential access memory.

31. A system for storing information, comprising:

a first digital bus configured to sequentially transmit a plurality of digital information groups each having a data string paired with an associated address of multiple bits;

a second digital bus configured to transmit the groups;

a first-in first-out memory with a number of multibit locations, said first-in first-out memory having an input port coupled to said first bus and an output port coupled to said second bus, said first-in first-out memory being configured to buffer transmission of the groups from said first bus to said second bus; and control logic operatively coupled to said first-in first-out memory, said first bus, and said second bus, said logic being configured to generate a plurality of values each representing the associated address for a corresponding one of a first number of the groups, the values each being stored in said first-in first-out memory and having fewer bits than the associated address being represented.

32. The system of claim 31, wherein:

said first-in first-out memory includes an input port and an output port; and said logic includes a comparator and a first multiplexer coupled between said input port and said digital device, and a latch and a second multiplexer coupled between a digital bus and said output port.

33. The system of claim 31, wherein the values each represent a difference between at least two different addresses from the groups.

34. The system of claim 31, wherein said logic generates a first signal when said first-in first-out memory is empty and a second signal when said first-in first-out memory is full.

35. The system of claim 31, wherein the values are each stored in said first-in first-out memory in place of the associated address represented thereby and the associated address for each of a second number of the groups is stored directly in said first-in first-out memory.

36. The system of claim 35, wherein the values are each sized for storage in a single one of the locations, and the associated address for each of the second number of groups has a size requiring at least two of the locations for storage.

37. The system of claim 31, wherein the locations each have a first bit length, the values each have a second bit length, the associated address has a third bit length, the second bit length does not exceed the first bit length, and the third bit length is greater than the first bit length.

* * * * *